United States Patent [19]
Lovgren et al.

[11] Patent Number: 5,159,529
[45] Date of Patent: Oct. 27, 1992

[54] COMPOSITE LIQUID COOLED PLATE FOR ELECTRONIC EQUIPMENT

[75] Inventors: Eric P. Lovgren, Hurley; Donald P. Rearick, Shokan; Clifford B. Wells, Hyde Park, all of N.Y.

[73] Assignee: International Business Machines Corporation, Armonk, N.Y.

[21] Appl. No.: 700,728

[22] Filed: May 15, 1991

[51] Int. Cl.$^5$ .............................................. H05K 7/20
[52] U.S. Cl. .................... 361/385; 361/382; 361/386; 361/388; 357/81; 357/82; 165/80.4; 165/185
[58] Field of Search ............ 165/80.3, 80.4, 185; 174/15.1; 357/81, 82; 361/382, 385, 386, 388

[56] References Cited

U.S. PATENT DOCUMENTS

| | | |
|---|---|---|
| 2,906,103 | 9/1959 | Saltzman . |
| 3,524,497 | 8/1970 | Chu et al. . |
| 3,648,113 | 3/1972 | Rathjen et al. . |
| 3,788,393 | 1/1974 | Plizak . |
| 4,072,188 | 2/1978 | Wilson et al. . |
| 4,109,707 | 8/1978 | Wilson et al. . |
| 4,120,021 | 10/1978 | Roush . |
| 4,535,385 | 8/1985 | August et al. . |
| 4,612,978 | 9/1986 | Cutchaw . |
| 4,628,407 | 12/1986 | August et al. . |
| 4,712,158 | 12/1987 | Kikuchi et al. . |
| 4,938,279 | 7/1990 | Betker ................................. 361/385 |
| 4,998,181 | 3/1991 | Haws et al. ........................ 361/385 |

FOREIGN PATENT DOCUMENTS

| | | |
|---|---|---|
| 762960 | 2/1990 | Belgium . |
| 0065679 | 12/1982 | European Pat. Off. . |
| 57-207797 | 12/1982 | Japan . |
| 57-210295 | 12/1982 | Japan . |
| 61-29696 | 2/1986 | Japan . |
| 62-145122 | 12/1988 | Japan . |
| 1354502 | 5/1974 | United Kingdom . |

OTHER PUBLICATIONS

IBM Technical Disclosure Bulletin, vol. 13, No. 10 (Mar. 1971).
IBM Technical Disclosure Bulletin, vol. 20, No. 8 (Jan. 1978).
EG&G Wakefield Engineering Catalog Showing Series 180-10 and 180-11, p. 89.

*Primary Examiner*—Gregory D. Thompson
*Attorney, Agent, or Firm*—Sterne, Kessler, Goldstein & Fox

[57] ABSTRACT

A composite liquid cooled plate is disclosed having a heat transfer plate, preferably made of copper, on one or both sides of a core, which is preferably plastic. The core has flow channels to direct water against the heat transfer plates underneath the "hot" areas of the heat transfer plates, thereby providing a very low thermal resistance. The assembly remains lightweight by restricting the use of copper or other conducting materials to only the areas requiring thermal conduction.

15 Claims, 4 Drawing Sheets

COMPOSITE LIQUID COOLED PLATE FOR ELECTRONIC EQUIPMENT

DESCRIPTION

1. Technical Field

The present invention relates generally to a coolant management system and method and, more particularly, to a composite liquid cooled plate for electronic equipment.

2. Background Art

The reliability of many electronic components, such as those found in computers, is known to decrease with increasing temperature. It is also known that the operating characteristics of these electronic components vary appreciably over their range of operating temperatures so that performance often significantly deteriorates with increasing temperatures.

It has been found that less power is required to operate a component when the component is maintained at a cooler temperature. At high temperatures, however, such devices require more power to operate to a point where they can be rendered virtually unusable. This can occur even long before complete failure is reached.

In fact, it has been generally found that the life span of some electronic components is directly related to the temperatures at which the component operates. In general, the life span of some electronic components may be doubled by decreasing the operating temperature of the component by 10° C.

The primary device often used to cool electronic components, such as those found in computers, is called a heat sink. A heat sink generally consists of a large heat conducting plate to which components are attached in heat-conducting relation. One heat-conducting plate which is often used is called a coldplate. The coldplate is cooled by applying a cooling means, such as a liquid or gas coolant, to one side of the cooling plate while a component to be cooled is attached to the other side of the coldplate, thereby cooling that component.

Mainframe computers have often been equipped with devices to liquid cool the computer's components, such as a power regulator. These devices often cool computer components through the use of heat sinking "hot" components to liquid cooled plates. One design which is often used to cool power regulators is the "Wakefield Liquid Cooled Plate" manufactured by EG&G Wakefield Engineering, Wakefield, Mass. This plate comprises an extruded aluminum plate with flanges on the bottom surface which are crimped around a copper tube. Coolant is passed through the copper tube, thereby cooling the aluminum plate.

While the Wakefield liquid cooled plate is a relatively inexpensive device, it has several disadvantages. There is a significant thermal resistance across the interface between the copper tube and the aluminum plate. The tube can only be bent at a specific minimum radius, therefore dictating the number of tubes per area and their location which may or may not be under a "hot" component. In fact, the crimping of tubes in such a manner has been found to lead to variations in cooling of up to 50 percent. It is well known that the lower the thermal resistance between the component and the coolant, the cooler the "hot" component will operate. To minimize thermal resistance, "hot" components are often attached to the cooled plate over the coolant tubes. The use of tubes, however, limits how close a "hot" component is located to the coolant. Also, if the component is to be mounted on the liquid cooled plate, component mounting screws must avoid the tubes of the Wakefield liquid cooled plate, thereby resulting in a less dense total package.

Other devices which have been used to cool electronic equipment also suffer from significant disadvantages. In particular, these devices are often made from materials that have a significant weight. This weight, for some applications, would render the cooling system entirely unusable. In addition, these devices have done little to optimize coolant flow to those areas requiring the greatest heat transfer. Therefore, if several electronic components are to be cooled by these devices, the components are cooled without regard to the particular cooling requirements of each individual component.

DISCLOSURE OF INVENTION

It is with these problems of the background art in mind that the present invention was developed. The present invention not only overcomes the problems of the above-noted devices, but furthermore, has many advantages not previously achieved in known devices and methods of cooling electronic equipment.

The present invention comprises a coolant management system for cooling electrical components. The coolant management system comprises a first heat transfer plate with a high thermal conductivity for mounting to electronic components to be cooled, and a coolant management means for directing a coolant against the first heat transfer plate. Preferably, the first heat transfer plate is made of copper. The coolant management means has a lower thermal conductivity than the first heat transfer plate and is preferably formed from a plastic material capable of being molded into a desired shape. When the first heat transfer plate is attached to the coolant management means, a coolant cavity of desired flow characteristics is formed therebetween.

The present invention may also comprise a second heat transfer plate with a high thermal conductivity to which electronic components can be mounted, wherein the second heat transfer plate is attached to the coolant management means to form a second coolant cavity. In the alternative, the two coolant cavities may communicate with one another thereby permitting coolant to flow therebetween.

The present invention incorporates a number of features and advantages which will now be highlighted. The present invention features a composite liquid cooled plate for electronic equipment which is easily manufacturable and is particularly lightweight. By restricting the use of copper or other material with a high thermal conductivity to only those areas of the composite liquid cooled plate requiring thermal conduction, the composite liquid cooled plate remains relatively lightweight and compact in size.

An additional feature of the present invention is that it provides an optimized cooling path to direct coolant to areas requiring the greatest heat transfer. Therefore, if several electronic components are to be cooled, the composite liquid cooled plate of the present invention may be configured to account for the individual cooling requirements of each electronic component. The coolant management means, which is preferably a plastic core, of the composite liquid cooled plate has coolant flow channels to direct coolant against the plate underneath "hot" components, thereby providing a short conduction path between "hot" components and the coolant.

A further advantage can be achieved in enhancing final package design by first determining the layout of a computer (or other device) to be cooled and then routing the channels of the liquid cooled plate to appropriate areas of the plate requiring the greatest heat transfer.

Further features and advantages of the present invention, as well as the structure and operation of the preferred embodiments of the present invention, are described in detail below with reference to the accompanying drawings, and in the claims.

BRIEF DESCRIPTION OF DRAWINGS

The foregoing and other objects, aspects and features of the present invention will be more fully appreciated as the same becomes better understood when considered in conjunction with the detailed description of the present invention and the accompanying drawings in which.

BEST MODE FOR CARRYING OUT THE INVENTION

The present invention is a coolant management system which comprises a composite liquid cooled plate. As discussed in greater detail below, the liquid cooled plate is particularly useful in cooling devices requiring maximum cooling yet minimum weight in a limited amount of space.

Figure 1:
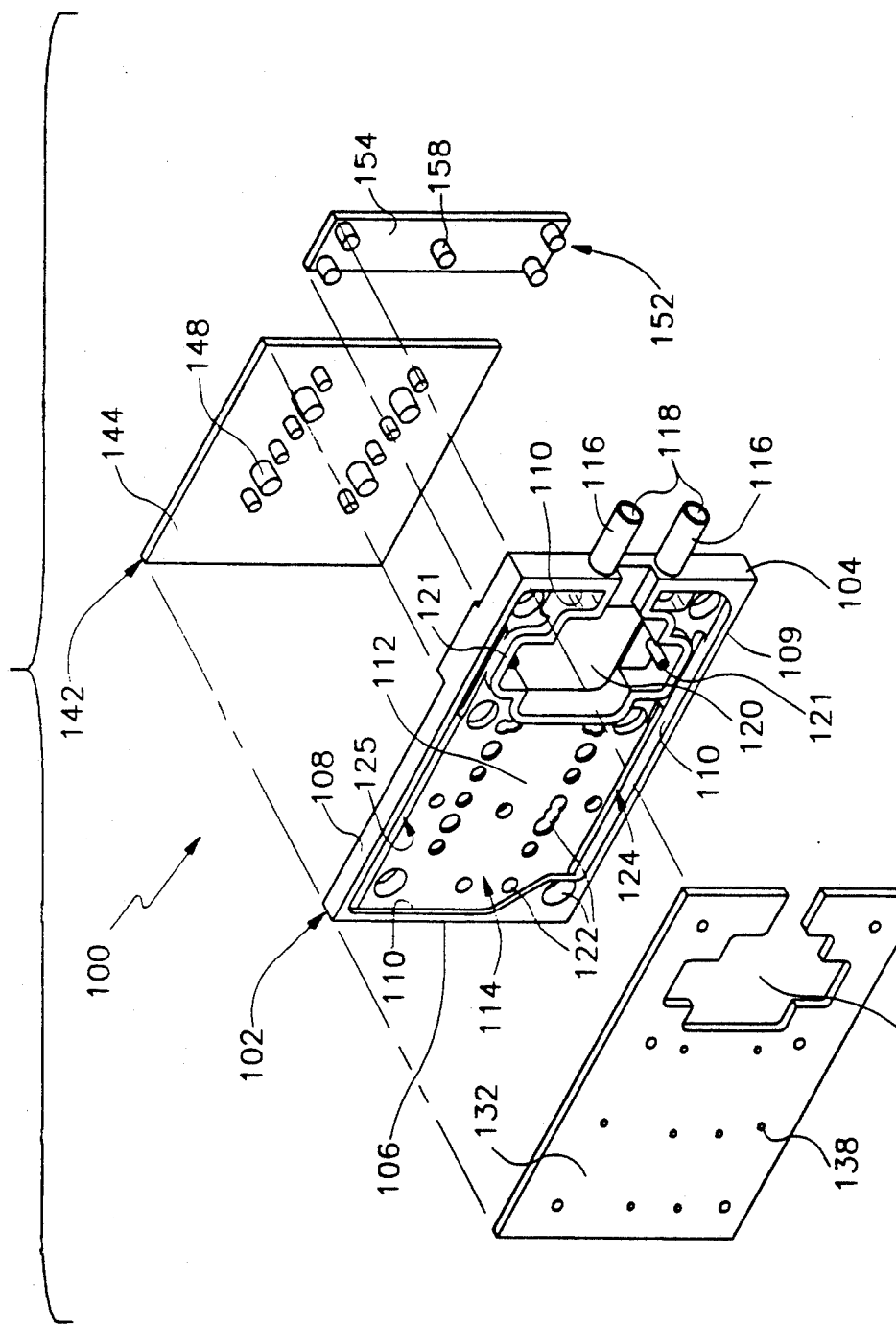
FIG. 1 is an exploded front perspective view of a first embodiment of the composite liquid cooled plate of the present invention.
Figure 2:
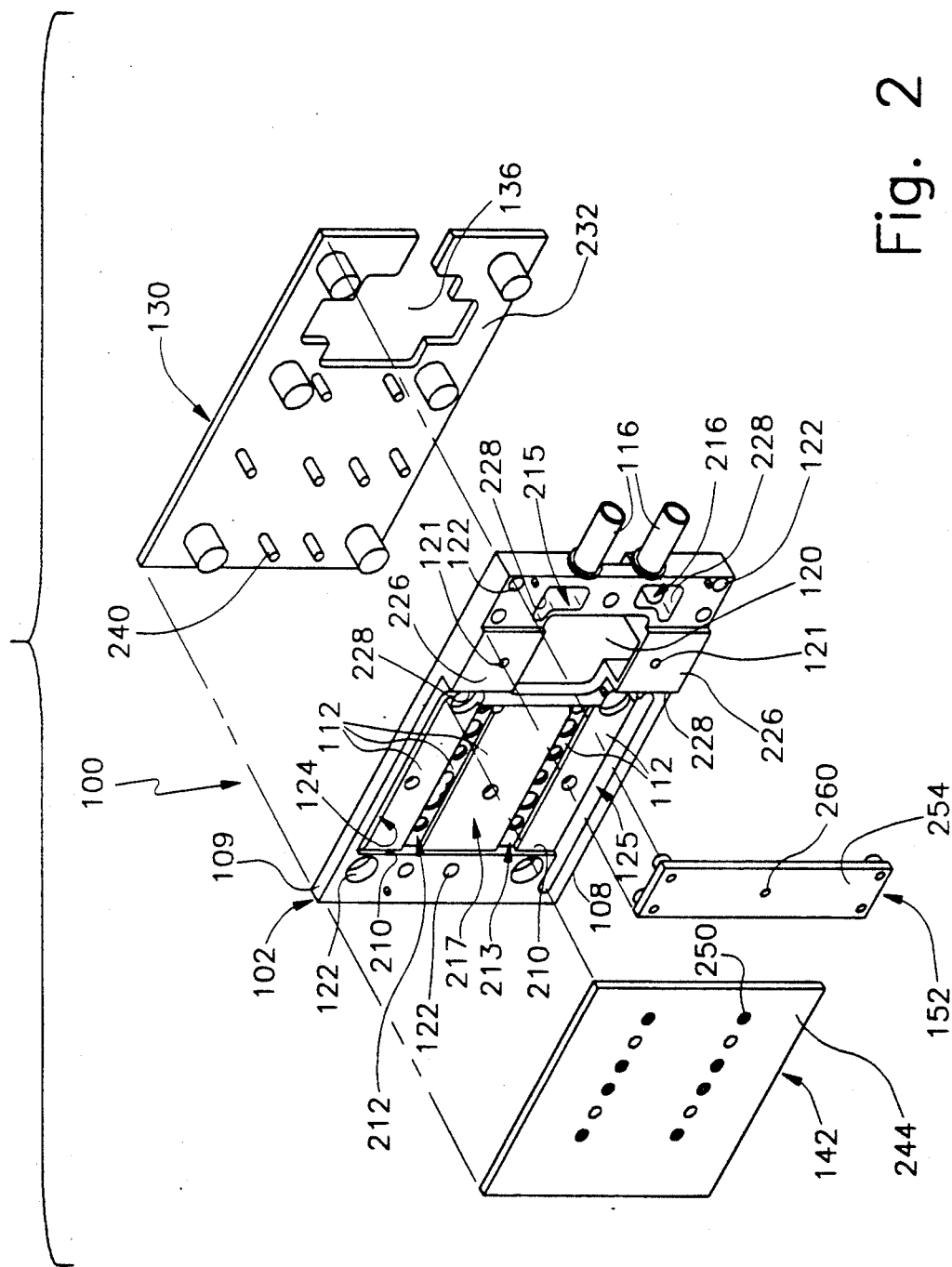
FIG. 2 is an exploded rear perspective view of the composite liquid cooled plate embodiment of FIG. 1.
Figure 3:
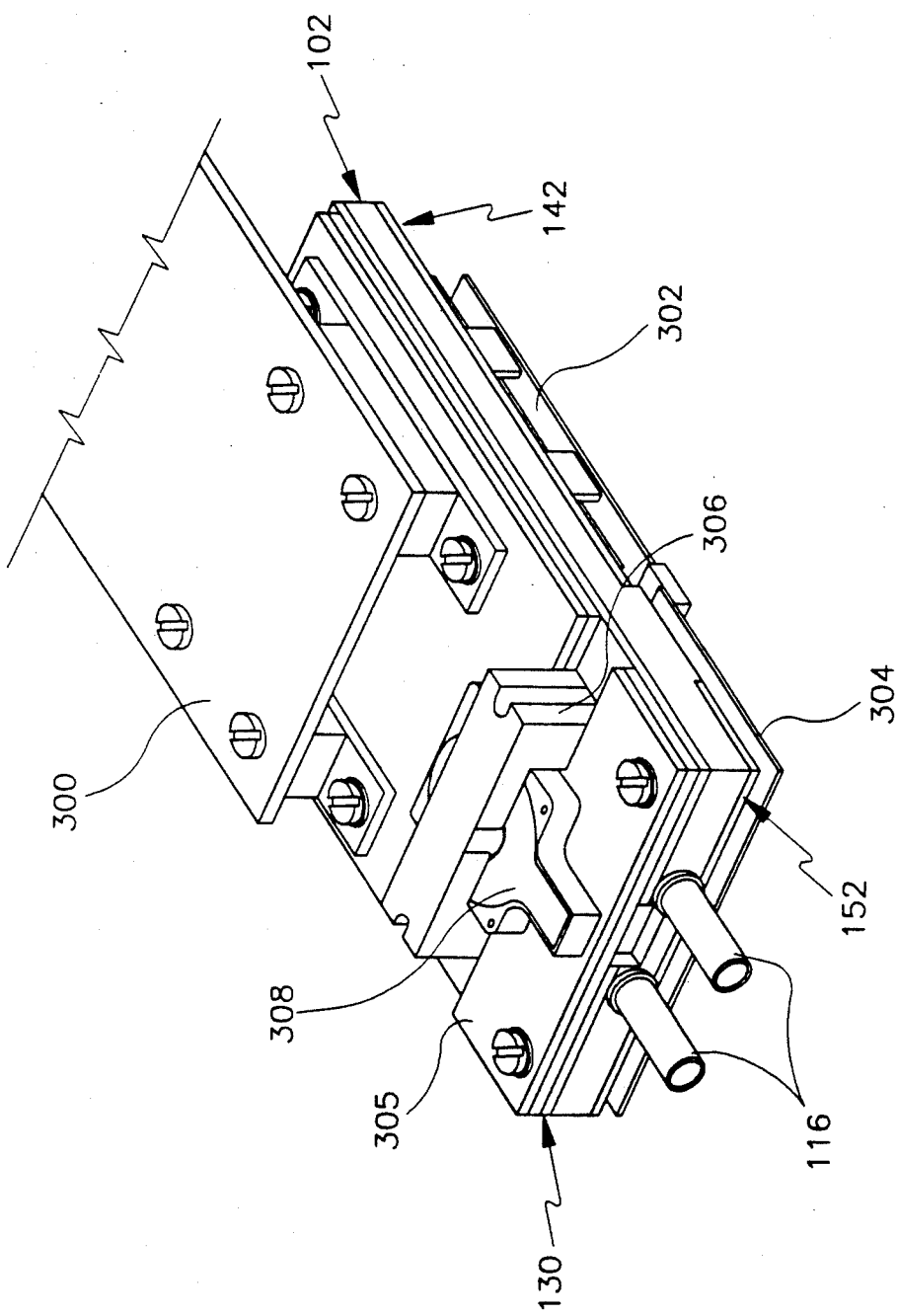
FIG. 3 is a side perspective view of the composite liquid cooled plate of FIG. 1 with electronic components mounted to both sides for conduction cooling.
Figure 4:
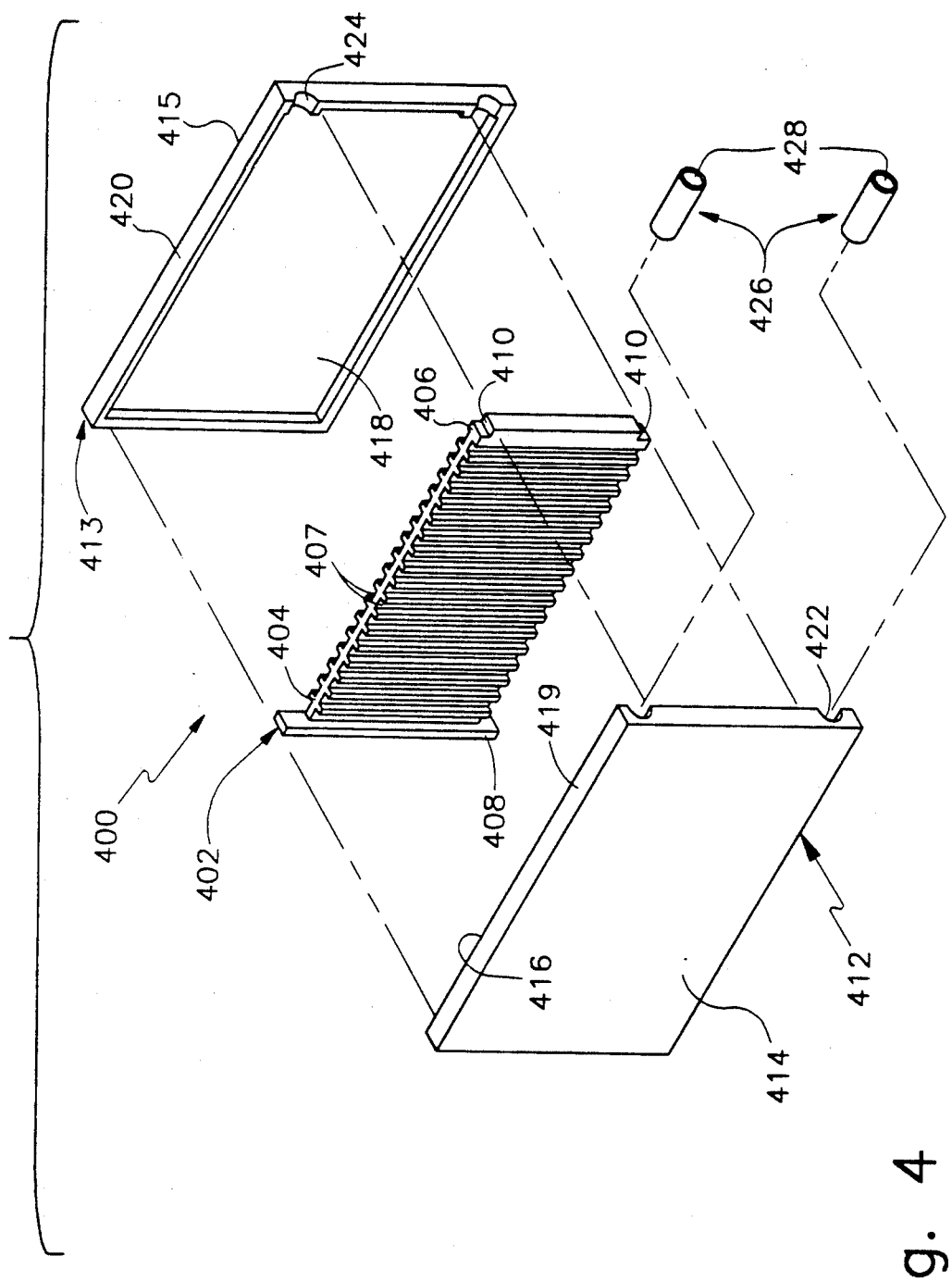
FIG. 4 is an exploded front perspective view of a second embodiment of the composite liquid cooled heat transfer plate of the present invention.

More specifically, the present invention comprises a composite liquid cooled plate for restricting the use of heavy conductive materials to those areas of the composite liquid cooled plate requiring heat transfer characteristics. In addition, the composite liquid cooled plate has at least one heat transfer plate and coolant management means configured to cause coolant to contact only selected areas of the heat transfer plate(s) requiring the greatest heat transfer. This is done so that the coolant provides the necessary cooling to each electronic component. In this way, each electronic component has a temperature during operation which is less than or equal to a predetermined value. Furthermore, this results in an optimized amount of liquid cooling being used to achieve the desired cooling result. A first embodiment of the present invention is shown in FIGS. 1-3 while a second embodiment is shown in FIG. 4. Representative values of the dimensions of the composite liquid cooled plate are indicated in the following description of the best mode for carrying out the invention. These values are to be considered exemplary in nature and are not to be considered as restrictions on the present invention. While two embodiments are shown and described, other embodiments can be devised to implement the present invention.

With continuing reference to FIGS. 1 and 2, the liquid cooled plate, indicated generally by reference numeral 100, is used to cool electronic components mounted on one or both sides of the plate 100. Liquid cooled plate 100 generally comprises four components: a core 102, a first heat transfer plate 130, a second heat transfer plate 142, and a third heat transfer plate 152, each of which will now be described in more detail.

Core 102, a means for managing coolant flow within the liquid cooled plate 100, will now be described in greater detail. Core 102 has two particular functions. First, core 102 is made of a material which is substantially lighter in weight than the conductive elements of composite liquid cooled plate 100. Therefore, core 102 serves to minimize the overall weight of composite liquid cooled plate 100. Second, core 102 is configured to cause coolant to flow through composite liquid cooled plate 100 such that the "hot" areas (the areas requiring the greatest heat transfer) of the plate 100 are contacted by the coolant. Thus, if more than one electronic component is to be cooled by plate 100, core 102 can be designed to account for the individual cooling requirement of each of the electronic components to be cooled.

Core 102 is preferably rectangular in shape having a proximal end 104, a distal end 106, a top portion 108 and a bottom portion 109. Although a rectangular shape is preferred, any shape may be used so long as it is compatible with the component(s) to be cooled and any structure surrounding the plate 100. Core 102 has a representative height of 4 inches and a representative length of 6.5 inches. Core 102 has a first lip 110 which extends along proximal end 104, distal end 106, top portion 108 and the bottom portion 109. Core 102 has a first flow-through hole 124 extending above and along bottom portion 109 (FIG. 1). Core 102 also has a second flow-through hole 125 extending below and along top portion 108 (FIG. 1).

Core 102 has a center wall 112 extending between first flow-through hole 124 and second flow-through hole 125 and is defined by lip 110. Center wall 112 has a representative thickness of 0.15 inches. Center wall 112 in conjunction with first flow-through hole 124, second flow-through hole 125 and lip 110 define a first channel 114. Center wall 112 in conjunction with first flow-through hole 124, second flow-through hole 125 and second lip 210 (FIG. 2) define a second flow channel 217. Flow channel 217 contains grooves 212, 213. A representative value for the thickness of channels 114 and 217 (not including grooves 212, 213) is 0.08 inches. Grooves 212, 213 have a representative thickness of 0.08 inches (which narrows center wall 112 to a thickness of 0.07 inches in these areas). Center wall 112 has aligning holes 122. Aligning holes 122 may extend from first channel 114 to second channel 217.

As indicated in FIG. 2, core 102 has pieces 226 which form a lumen 228 with core 102 through which coolant may pass. Pieces 226 permit communication from second channel 217 to grooves 215, 216 via lumen 228.

Core 102 has hose fittings 116 attached on proximal end 104 of core 102. Although hose fittings 116 are shown as both being on proximal end 104 of core 102, either or both of hose fittings 116 may be located independently along proximal end 104, distal end 106, top portion 108 or the bottom portion 109 of core 102 so long as each of hose fittings 116 leads to channels 114 and 217. Hose fittings 116 each have a center lumen 118 through which cooling liquid may be passed to channels 114 and 217.

Core 102 has a mounting hole 120 through which an external component can be mounted. Screw holes 121 formed in pieces 226 are used to mount the external component to composite liquid cooled plate 100. Although a particular shape for mounting hole 120 is indicated in FIGS. 1 and 2, any shape can be used so long as it facilitates the external component to be mounted therein or, in the alternative, hole 120 may be eliminated.

Preferably, core 102 is made of a plastic material such as polysulfone. Plastics in general are preferred because they are lightweight, relatively inexpensive and can be inexpensively formed into complex shapes. Polysulfone is preferred because it is a highly temperature stable material and will not absorb the preferred coolant, water. Preferably, the specific type of polysulfone used is Udel TM, manufactured by Amoco Performance Products, Inc. under the material code: P1700 series. In the alternative, any material which is inert in respect to the coolant may be used. A material is determined to be inert if it does not contaminate the coolant and it does not absorb the coolant.

With continuing reference to FIGS. 1 and 2, first heat transfer plate 130 will now be described in greater detail. First heat transfer plate 130 is preferably rectangularly shaped. Heat transfer plate 130 has a mounting side 132 and a channel side 232. Channel side 232 faces channel 114 of core 102 and preferably extends the length of core 102 from proximal end 104 to distal end 106 and from top portion 108 to the bottom portion 109 of core 102. First heat transfer plate 130 has a mounting hole 136 through which a component may be mounted. Although mounting hole 136 is shown as having a particular shape, any shape may be used so long as it is compatible with the shape of mounting hole 120 of core 102 and the external component to be mounted.

First heat transfer plate 130 has screw mounting holes 138 to which an electronic component to be cooled can be mounted. Although fourteen screw-mounting holes 138 are shown, any number of holes 138 can be used as long as the component to be cooled is properly mounted on mounting side 132 of heat transfer plate 130. Screw mounting holes 138 extend through heat transfer plate 130 and into cylindrical bosses 240. Cylindrical bosses 240 are projections which extend from channel side 232 of heat transfer plate 130 toward core 102. Although bosses 240 are shown as cylindrically-shaped objects, any geometric shape can be used so long as they are compatible with aligning holes 122 of core 102. For example, fins may be used to enhance thermal transfer in a specific area and/or to increase flexural rigidity. In addition, although fourteen cylindrical bosses 240 are shown, any number of cylindrical bosses can be used as long as they are compatible with core 102.

Although a rectangularly shaped heat transfer plate 130 is preferred, any shape can be used so long as it is compatible with the component(s) to be cooled, any surrounding structure into which liquid cooled plate 100 is to be located, and the shape of core 102; the size and shape chosen for heat transfer plate 130 must also be sufficient to form a first coolant cavity with core 102 from proximal end 104 to distal end 106 of core 102 when heat transfer plate 130 is attached to core 102 and bosses 240 extend into aligning holes 122 of core 102.

With continuing reference to FIGS. 1 and 2, second heat transfer plate 142 will now be described in greater detail. Second heat transfer plate 142 has a mounting side 244 and a channel side 144. Heat transfer plate 142 is preferably rectangularly shaped although any shape can be used so long as it is compatible with the component(s) to be cooled, any surrounding structure into which liquid cooled plate 100 is to be located, and the shape of core 102. As shown in FIG. 1, second heat transfer plate 142 has cylindrically shaped bosses 148 extending from channel side 144 of heat transfer plate 142 toward core 102. Although twelve cylindrically shaped bosses 148 are shown, any number and shape can be used so long as they are compatible with aligning holes 122 of core 102. For example, fins may be used to enhance thermal transfer in a specific area and/or to increase flexural rigidity.

As shown in FIG. 2, heat transfer plate 142 has screw mounting holes 250 to which an electronic component to be cooled may be mounted. Screw mounting holes 250 extend through the mounting side 244 of heat transfer plate 142 and into bosses 148. Although twelve such screw mounting holes 250 are shown, any number of screw mounting holes 250 can be used so long as the component(s) to be cooled is properly mounted to mounting side 244 of heat transfer plate 142. The size and shape of heat transfer plate 142 is sufficient to form a second coolant cavity with channel 217 when heat transfer plate 142 is attached to core 102 and bosses 148 extend into aligning holes 122 of core 102.

Third heat transfer plate 152 will now be described in greater detail. Third heat transfer plate 152 has a mounting side 254 and a channel side 154. Heat transfer plate 152 has cylindrical bosses 158 extending from channel side 154 of heat transfer plate 152 toward core 102. Although five cylindrical bosses 158 are shown, any number and shape can be used so long as they are compatible with core 102. For example, fins may be used to enhance thermal transfer in a specific area and/or to increase flexural rigidity.

As shown in FIG. 2, heat transfer plate 152 has screw mounting holes 260 to which a component to be cooled can be mounted. Although five screw mounting holes 260 are shown, any number of screw mounting holes can be used so long as the component to be mounted is properly mounted on mounting side 254 of heat transfer plate 152.

Heat transfer plate 152 is also preferably rectangularly shaped although any shape can be used so long as it is compatible with the component(s) to be cooled, any structure surrounding liquid cooled plate 100, and the shape of core 102. The size and shape of heat transfer plate 152 is sufficient to form coolant cavities with grooves 215, 216 when heat transfer plate 152 is attached to core 102 and bosses 158 extend into aligning holes 122 of core 102.

The process of properly manufacturing and assembling the liquid cooled plate 100 will now be described. Preferably, the liquid cooled plate 100 is designed to cause coolant to flow to those areas of the heat transfer plate requiring the greatest heat transfer. Before configuring liquid cooled plate 100, the cooling requirement of each electronic component to be cooled is first determined. Core 102 is then preferably molded to a desired shape such that it causes the liquid coolant to flow to selected areas of the liquid cooled plate 100 requiring the greatest heat transfer. This is done so that the coolant provides the necessary cooling to each electronic component such that the cooling requirement of each electronic component is fulfilled. Cooling requirements are determined to be fulfilled when each of electronic components operates below a predetermined temperature. The predetermined temperature is directly related to the optimum operating conditions of the electronic component(s) to be cooled. Therefore, several electronic components to be cooled, each having individual cooling requirements and individual optimum operating temperatures, may be cooled such that each electronic component is in fact cooled to or below a predetermined temperature. In configuring core 102 for its optimum shape, factors to be considered include the surface area of the heat transfer plates which will be in contact with the liquid coolant and the amount of liquid coolant needed to adequately cool each of the surface areas such that the cooling requirements are fulfilled. Thus, core 102 may be configured such that larger amounts of coolant are caused to flow to particular areas of composite liquid cooled plate 100.

Core 102 is preferably molded because it is the least expensive technique for manufacturing core 102 (particularly if core 102 involves a complex channel configuration 114, 217) and it minimizes the build-up of stresses in core 102 which could lead to warping of the structure. However, core 102 may be formed using other suitable, conventionally-known techniques. Core 102 is manufactured to provide channels 114 and 217 to cause the coolant to flow under the components needing the greatest heat transfer when liquid cooled plate 100 is properly mounted in a device such as a computer. Thus, core 102 can be manufactured to accommodate an elaborate flow channel configuration with negligible effect on part cost. For example, channel 217 may be formed with grooves 212, 213 to provide particular flow characteristics within liquid cooled plate 100. Grooves 212, 213 of the preferred embodiment were formed to maintain an approximately consistent cross-sectional area of flow in channel 217 to compensate for the extension of bosses 148 into channel 217.

Heat transfer plates 130, 142 and 152 are preferably made of copper. A representative value for the thickness of plates 130, 142 and 152 is 0.125 inches. Copper is preferred because it has a high thermal conductivity (approx. 400 Watts/meter° K.). In the alternative, however, heat transfer plates 130, 142 and 152 can be made of other conducting materials with a thermal conductivity above 100 watts/meter° K. Heat transfer plates 130, 142 and 152 are also preferably cast. In the alternative heat transfer plates 130, 142 and 152 may be formed using other suitable, conventionally-known techniques.

Screw mounting holes 138, 250 and 260 are preferably drilled into bosses 240, 148 and 158, respectively. Mounting surfaces 132, 244 and 254 are then plated with a material such as tin or nickel to protect the surfaces. Although tin and nickel are indicated, other materials may also be used depending on the material used for plates 130, 142 and 152. Channel sides 144, 154 and 232 may also be plated with tin or nickel in select areas. Critical surfaces of plates 130, 142 and 152 can be machined for smoothness. Preferably, heat transfer plates 130, 142 and 152 are then bonded to the core 102 using an adhesive. In the alternative, heat transfer plates 130, 142 and 152 may be secured to core 102 using other conventionally-known techniques. For example, heat transfer plates 130, 142 and 152 may be secured to core 102 using both an 0-ring to seal the arrangement and securing means (such as a bolt) to hold the arrangement together. When placing heat transfer plates 130, 142 and 152 together with core 102 to form liquid cooled plate 100, bosses 148, 158 and 240 align with aligning holes 122 of core 102 to form the composite liquid cooled plate 100 such that channel 114 defines a first coolant cavity between heat transfer plate 130 and core 102, and channel 217 defines a second coolant cavity between core 102 and the combination of second heat transfer plate 142, third heat transfer plate 152 and pieces 226. Flow-through holes 124, 125 may permit the two cavities to communicate with one another, or, in the alternative, flow-through holes 124, 125 may be intentionally blocked thereby maintaining the two cavities separate from one another.

In use, liquid cooled plate 100 is mounted along heat transfer plate 130 to a first component to be cooled, and along heat transfer plates 142 and 152 to a second (or the first) component to be cooled. Turning to FIG. 3, composite liquid cooled plate 100 is shown with electronic components 300, 302, 304 and 305 mounted on plates 130, 142 and 152. In addition, electronic component 306 is shown as mounted in mounting hole 120 of core 102 and mounting hole 136 of plate 130. Electronic component 306 contains electronic component 308 which is cooled by plate 130 via electronic component 305. Coolant, preferably water, flows through a first hose fitting 116, through channels 114 and 217 (thereby cooling select areas of heat transfer plates 130, 142 and 152) and exits a second hose fitting 116. Flow-through holes 124, 125 permit the liquid coolant to flow between first channel 114 and second channel 217. Coolant flowing through channels 114, 217 cool selective "hot" areas of heat transfer plates 130, 142 and 152 thereby providing a relatively short conduction path between the components to be cooled 300, 302, 304 and 305 and the coolant.

Liquid cooled plate 100 is designed to operate with a coolant pressure of 50 p.s.i. The plate 100 is tested, however, to operate at 150 p.s.i. Although water is the preferred coolant because it provides optimum heat transfer, fluorinert or any other suitable liquid coolant may also be used. The water or other liquid coolant may be treated so as to minimize corrosion of the heat transfer plates.

Although in the preferred embodiment, shown in FIGS. 1-3, composite liquid cooled plate 100 has heat transfer plates mounted on both sides of core 102 to facilitate electronic components to be mounted on either or both sides of plate 100, it can be seen that if an electronic component is only mounted to one side of the liquid cooled plate 100, the heat transfer plates 142, 152 could be eliminated from the core 102. In such a situation, aligning holes 122 would be partially closed (so that holes 122 do not extend all the way through center wall 112 from first channel 114 to second channel 217), thereby obviating the need for second channel 217.

Turning to FIG. 4, a second embodiment of the present invention is shown. The liquid cooled plate, indicated generally by reference numeral 400, generally comprises the following basic components: core 402, a first heat transfer plate 412, a second heat transfer plate 413 and hose fittings 426, each of which will now be described in more detail.

With continuing reference to FIG. 4, core 402 will now be described in greater detail. Core 402 is generally rectangular in shape and is preferably made of polysulfone although other suitable plastics may also be used. Core 402 has a first end 404 and a second end 406. Core 402 has coolant flow channels 407 on both sides of core 402. Although a particular number and arrangement of flow channels 407 are shown, any number and any particular arrangement may be used to configure core 402 to cause coolant to flow to selected areas of plates 412, 413 requiring the greatest heat transfer. Stabilizing bar 408 is located on first end 404 of core 402. Notches 410 are located on the second end 406 of core 402.

First heat transfer plate 412 and second heat transfer plate 413 will be described in greater detail. Although variations between heat transfer plates 412 and 413 are possible, heat transfer plates 412 and 413 are preferably identical to reduce cost. Heat transfer plates 412 and 413 are preferably rectangular in shape although any shape can be used so long as it is compatible with core 402 and the component to be cooled. Each heat transfer plate 412, 413 has an outer side 414, 415 for placement in contact with a component or components to be cooled. Screw holes (not shown) may be added to outer sides 414, 415 although the screw holes may not extend all the way through plates 412, 413. Each heat transfer plate 412, 413 has a recessed area 416 and 418, respectively, for locating core 402 therein. Recessed area 416 is defined by walls 419 of heat transfer plate 412. Recessed area 418 is defined by walls 420 of heat transfer plate 413. When heat transfer plates 412 and 413 are placed together, recessed areas 416 and 418 form an internal cavity.

Although no projections are shown extending from recessed areas 416, 418, projections such as bosses, fins and structural ribs may be located on recessed areas 416, 418.

Heat transfer plates 412 and 413 each have two semicircular indents 422, 424 within walls 419 and 420 for attachment to hose fittings 426. Hose fittings 426 have an internal lumen 428 for passing coolant.

The process of properly assembling and using the liquid cooled plate 400 will now be described. Heat transfer plates 412, 413 and hose fittings 426 are preferably made of copper. Copper is preferred because it has a high thermal conductivity (approx. 400 watts/meter° K.). In the alternative, however, heat transfer plates 412, 413 and hose fittings 426 can be made of any material having a thermal conductivity above 100 watts/meter° K. Heat transfer plates 412, 413 are preferably machined. In the alternative, however, other suitable, conventionally-known techniques may also be used. Outer sides 414 and 415 are preferably plated with tin or nickel to protect their surfaces.

Core 402 is preferably molded to the desired shape. Molding is preferred as it is an inexpensive process which minimizes the build-up of stresses within core 402 and, thus, minimizes warping of core 402. However, core 402 may be formed using other suitable, conventionally-known techniques. Channels 407 are preferably configured to permit coolant flow to select areas of heat transfer plates 412, 413 requiring the greatest heat transfer. Stabilizing bar 408 is preferably molded to a length compatible with the length of recessed areas 416 and 418 of heat transfer plates 412, 413 such that when core 402 is located with recessed areas 416 and 418, core 402 is immobilized within heat transfer plates 412 and 413. Core 402 is then inserted between heat transfer plates 412 and 413. Hose fittings 426 are placed within indents 422, 424 of heat transfer plates 412, 413. Conventional metallurgical methods of sealing heat transfer plates 412 and 413 with hose fittings 426 are then preferably used to encapsulate core 402. (Encapsulate is defined as the total enclosure of core 402 within plates 412, 413 to which access is permitted only through lumens 428 of hose fittings 426.) Metallurgical methods which can be used include brazing, electron beam welding and soldering. In the alternative, adhesives may be used to seal plates 412, 413. Coolant cavities are formed between heat transfer plate 412 and channels 407 of core 402. Second coolant cavities are also formed between heat transfer plate 413 and channels 407 of core 402. Composite liquid cooled plate 400 is designed so that all the coolant cavities communicate with one another thereby forming one enlarged coolant cavity. In the alternative, core 402 may be designed so that some of the coolant cavities are isolated from other cavities.

In use, liquid cooled plate 400 is attached to an electronic component to be cooled. A coolant such as water, fluorinert or other suitable liquid flows through a first hose fitting 426, continues on through channels 407 formed between core 402 and heat transfer plates 412, 413, and exits via a second hose fitting 426. Channels 407 are preferably designed to cause the coolant to contact select areas of heat transfer plates 412, 413 requiring the greatest heat transfer. Plate 400 is also designed to operate with coolant pressures of 50 p.s.i. although it is pressure-tested to operate up to 150 p.s.i.

The principles, preferred embodiments, and modes of operation of the present invention have been described in the foregoing specification. The invention which is intended to be protected herein should not, however, be construed as limited to the particular forms disclosed, as those are to be regarded as illustrative rather than restrictive. Variations and changes may be made by those skilled in the art without departing from the spirit of the invention. Accordingly, the foregoing detailed description should be considered exemplary in nature and not limited to the scope and spirit of the invention as set forth in the attached claims.

We claim:

1. A coolant management system for cooling electrical components using a coolant, said system comprising:
   (a) a first heat transfer plate, said first heat transfer plate having a high thermal conductivity, wherein said first heat transfer plate includes a mounting side for mounting electronic components and a flow channel side; and
   (b) coolant management means for directing the coolant against said first heat transfer plate, said coolant management means having a lower thermal conductivity than said high thermal conductivity of said first heat transfer plate, said coolant management means being capable of being molded into a desired shape, wherein said first heat transfer plate is attached to said coolant management means so as to be in direct thermal connection with the coolant and to form a first coolant cavity, wherein said first heat transfer plate includes a projection extending from said flow channel side toward said coolant management means, said coolant management means comprising flow channels configured to cause coolant flow to be substantially increased at selected areas of said first heat transfer plate.

2. The coolant management system of claim 1 further comprising a second heat transfer plate, said second heat transfer plate having a high thermal conductivity, wherein said second heat transfer plate includes a mounting side for mounting electronic components and a flow channel side, wherein said second heat transfer plate is attached to said coolant management means so as to be in direct thermal connection with the coolant and to form a second coolant cavity.

3. The coolant management system of claim 2 wherein said coolant management means has means to permit communication between said first coolant cavity and said second coolant cavity.

4. The coolant management system of claim 2 wherein said second heat transfer plate includes a projection extending from said flow channel side toward said coolant management means.

5. The coolant management system of claim 2 wherein said coolant management means is an insert encapsulated between said first heat transfer plate and said second heat transfer plate.

6. The coolant management system of claim 2 wherein said coolant management means further comprises flow channels configured to cause coolant to contact only selected areas of said second heat transfer plate.

7. The coolant management system of claim 2 further comprising at least one hose connection fitting, said at least one hose connection fitting having an internal lumen for passing coolant to said coolant management means.

8. The coolant management system of claim 7 wherein said first heat transfer plate, said second heat transfer plate and said at least one hose connection fitting are metallurgically joined.

9. The coolant management system of claim 7 wherein said at least one hose connection fitting is integral with said coolant management means.

10. The coolant management system of claim 1 wherein said first heat transfer plate and said coolant management means are glued together to form said coolant management system.

11. A coolant management system for cooling electrical components using a coolant, said system comprising:
 (a) a first heat transfer plate, said first heat transfer plate being made of a material having a high thermal conductivity, wherein said first heat transfer plate includes a mounting side for mounting electronic components and a flow channel side;
 (b) a second heat transfer plate, said second heat transfer plate being made of a material having a high thermal conductivity, wherein said second heat transfer plate includes a mounting side for mounting electronic components and a flow channel side;
 (c) coolant management means for directing the coolant against said first heat transfer plate and said second heat transfer plate, said coolant management means having a lower thermal conductivity than said high thermal conductivity of said first heat transfer plate and said high thermal conductivity of said second heat transfer plate, said coolant management means being formed from material capable of being molded into a desired shape, wherein said first heat transfer plate and said second heat transfer plate encapsulate said coolant management means so as to be in direct thermal connection with the coolant and to form at least one coolant cavity, wherein said first heat transfer plate includes a projection extending from said flow channel side toward said coolant management means, said coolant management means comprising flow channels configured to cause coolant flow to be substantially increased at selected areas of said first heat transfer plate.

12. The coolant management system of claim 11 wherein said first heat transfer plate and said second heat transfer plate are made of copper.

13. The coolant management system of claim 11 wherein said coolant management means further comprises flow channels configured to cause coolant to contact only selected areas of said second heat transfer plate.

14. The coolant management system of claim 11 wherein said second heat transfer plate includes a projection extending from said flow channel side toward said coolant management means.

15. The coolant management system of claim 13 wherein said second heat transfer plate includes a projection extending from said flow channel side toward said coolant management means.

* * * * *